(12) United States Patent
Portolan

(10) Patent No.: US 9,341,676 B2
(45) Date of Patent: May 17, 2016

(54) PACKET-BASED PROPAGATION OF TESTING INFORMATION

(75) Inventor: Michele Portolan, Arpajon (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/267,959

(22) Filed: Oct. 7, 2011

(65) Prior Publication Data

US 2013/0091396 A1    Apr. 11, 2013

(51) Int. Cl.
*H03M 13/00*    (2006.01)
*G01R 31/3185*    (2006.01)

(52) U.S. Cl.
CPC *G01R 31/318555* (2013.01); *G01R 31/318572* (2013.01)

(58) Field of Classification Search
CPC ... H04L 1/0057; H04L 1/0061; H04L 1/0041; H04L 1/0083; H04L 1/0072
USPC .......................................................... 714/776
See application file for complete search history.

(56) References Cited

U.S. PATENT DOCUMENTS

| | | | |
|---|---|---|---|
| 5,079,696 A | 1/1992 | Priem et al. | |
| 5,487,066 A * | 1/1996 | McNamara et al. | 370/436 |
| 6,188,912 B1 | 2/2001 | Struhsaker et al. | |
| 6,782,503 B1 * | 8/2004 | Dawson | H04L 12/2697 714/739 |
| 6,914,637 B1 * | 7/2005 | Wolf et al. | 348/473 |
| 7,124,349 B2 * | 10/2006 | Barrett et al. | 714/776 |
| 7,587,643 B1 | 9/2009 | Chopra | |
| 7,602,729 B2 | 10/2009 | Wheatley et al. | |
| 8,132,071 B2 * | 3/2012 | Hayashi | 714/751 |
| 8,681,817 B2 * | 3/2014 | Anderson et al. | 370/474 |
| 2001/0035834 A1 * | 11/2001 | Variyam et al. | 341/120 |
| 2002/0097682 A1 | 7/2002 | Enam et al. | |
| 2002/0122477 A1 | 9/2002 | Murata | |
| 2002/0159393 A1 | 10/2002 | Smith et al. | |
| 2003/0099238 A1 | 5/2003 | Payne et al. | |

(Continued)

FOREIGN PATENT DOCUMENTS

| | | |
|---|---|---|
| JP | 2002-024054 | 1/2002 |
| JP | 2004-110699 | 4/2004 |

(Continued)

OTHER PUBLICATIONS

C.-H. Chiang, et al., "Testing and Remote Field Update of Distributed Base Stations in a Wireless Network," ITC International Test Conference, 2004 IEEE, Paper 25.2, pp. 711-718.

(Continued)

*Primary Examiner* — Albert Decady
*Assistant Examiner* — Enam Ahmed
(74) *Attorney, Agent, or Firm* — Tong, Rea, Bentley & Kim, LLC

(57) ABSTRACT

A packet-based testing capability is provided. The packet-based testing capability is configured to provide a packet-based JTAG (PJTAG) protocol. The PJTAG protocol is an asynchronous protocol configured to support the synchronous JTAG protocol. The PJTAG protocol is configured to convert between JTAG signals and packets configured to transport information of the JTAG signals (e.g., to convert JTAG signals into PJTAG packets at an interface from a JTAG domain to a PJTAG domain and to convert PJTAG packets into JTAG signals at an interface from a PJTAG domain to JTAG domain).

25 Claims, 9 Drawing Sheets

(56) References Cited

U.S. PATENT DOCUMENTS

| | | | |
|---|---|---|---|
| 2003/0110344 A1* | 6/2003 | Szczepanek | H04L 12/40013 711/100 |
| 2003/0179831 A1 | 9/2003 | Gupta et al. | |
| 2003/0217324 A1* | 11/2003 | Nielsen et al. | 714/776 |
| 2004/0021595 A1* | 2/2004 | Erdogan | H03H 17/0288 341/144 |
| 2004/0179852 A1 | 9/2004 | Westbrook et al. | |
| 2004/0252709 A1 | 12/2004 | Fineberg | |
| 2005/0060487 A1 | 3/2005 | Barth et al. | |
| 2005/0286507 A1 | 12/2005 | Sterling et al. | |
| 2006/0050640 A1 | 3/2006 | Jin et al. | |
| 2006/0156067 A1 | 7/2006 | Swoboda | |
| 2007/0234154 A1* | 10/2007 | Whetsel | 714/727 |
| 2007/0280196 A1* | 12/2007 | Olgaard et al. | 370/351 |
| 2011/0019657 A1 | 1/2011 | Zaher | |

FOREIGN PATENT DOCUMENTS

| | | |
|---|---|---|
| JP | 2008-171504 | 7/2008 |
| JP | 2011-193143 | 9/2011 |

OTHER PUBLICATIONS

B. Eklow et al., "Simulation Based System Level Fault Insertion Using Co-Verification Tools," ITC International Test Conference, 2004 IEEE, Paper 25.1, pp. 704-710.

F. P. Higgins and R. Srinivasan, "BSM2: Next Generation Boundary-Scan Master," Proceedings IEEE VLSI Test Symposium, pp. 67-72, 2000.

L. Whetsel, "A Proposed Method of Accessing 1149.1 in a Backplane Environment," Proceedings IEEE International Test Conference, pp. 206-216, 1992.

B. Van Treuren and J. M. Miranda, "Embedded Boundary Scan," IEEE Design and Test of Computers, pp. 20-25, Mar. 2003.

IEEE Std 1149.6-2003, "IEEE Standard Boundary-Scan Testing of Advanced Digital Networks," IEEE, USA, 2003.

IEEE Std 1149.1-2001, "IEEE Standard Test Access Port and Boundary-Scan Architecture," IEEE, USA, 2001.

497AE and 1215E Boundary-Scan Master 2 Advanced Operational Mode, User Manual, Agere Systems, Apr. 2001.

R. W. Barr et al., "End-to-End Testing for Boards and Systems Using Boundary Scan," Proceedings IEEE International Test Conference, pp. 585-592, 2000.

H. Braunisch and R. Nair, "On the Techniques of Clock Extraction and Oversampling," Proceedings IEEE Symposium on High Performance Interconnects, pp. 139-143, 2001.

IEEE Std 1532-2002, "IEEE Standard for In-System Configuration of Programmable Devices," IEEE, USA, 2002.

IEEE Std 1500-2005, "IEEE Standard Testability Method for Embedded Core-Based Integrated Circuits," IEEE, USA, 2005.

P1687 homepage, http://grouper.ieee.org/groups/1687/, printed Oct. 13, 2011.

SJTAG homepage, http://www.sjtag.org printed Oct. 13, 2011.

Universal Serial Bus standard homepage, http://www.usb.org/home, printed Oct. 13, 2001.

IEEE 802.3 Ethernet Working Group, http://www.ieee802.org/3/index.html, printed Oct. 13, 2011.

P. Collins et al., "A Transparent Solution for Providing Remote Wired or Wireless Communication to Board and System Level Boundary-Scan Architectures," Proceedings of the 2005 International Test Conference (ITC05), Paper 2.2, International Test Conference, IEEE, 2005.

Advanced TCA Official Webside, printed Oct. 18, 2011.

"GDB: the GNU Project Debugger," http://www.gnu.org/software/gdb/, printed on Oct. 13, 2011.

IEEE Std 1149.7, "IEEE Standard for Reduced-Pin and Enhanced-Functionality Test Access Port and Boundary-Scan Architecture," IEEE, USA, 2009.

T. I. Inc., SN54ABT8996, SN74ABT8996,10-Bit Addressable Scan Ports, Multidrop-Addressable IEEE STD 1149.1(JTAG) TAP Transceivers, TI Web Site, SCBS489C, Aug. 1994—Revised Apr. 1999, pp. 1-40.

Office Action received in corresponding Japanese Application No. 2014-533828, dated Apr. 9, 2015, pp. 1-7.

Japanese Office Action dated Jan. 5, 2016 from corresponding JP 2014-533828 Application, p. 6.

* cited by examiner

PACKET-BASED PROPAGATION OF TESTING INFORMATION

TECHNICAL FIELD

The invention relates generally to testing and, more specifically but not exclusively, to controlling propagation of information related to testing.

BACKGROUND

Joint Test Action Group (JTAG) or Institute of Electrical and Electronics Engineers (IEEE) 1149.1 is a standard for automated digital testing. While JTAG was initially developed primarily for interconnection testing, it has since evolved into a solution for accessing components and for performing other test and maintenance functions, and many related standards and approaches have been developed in this regard. While most of these standards and approaches are effective in the circuit/board space in which components are accessed via an 1149.1 circuit composed of scan registers, they may be inefficient or even ineffective for accessing remote components.

SUMMARY

Various deficiencies in the prior art are addressed by embodiments for supporting packet-based JTAG testing.

In one embodiment, an apparatus includes a component configured to receive a plurality of test signals and generate one or more associated test packets. The test signals include a test data signal, a test control signal, and a test clock signal. The one or more test packets are generated via sampling of the test data signal and the test control signal using the test clock signal without sampling the test clock signal, and the test clock signal is represented as bit alignment information within the one or more test packets.

In one embodiment, a method includes receiving a plurality of test signals and generating one or more associated test packets. The test signals include a test data signal, a test control signal, and a test clock signal. The one or more test packets are generated via sampling of the test data signal and the test control signal using the test clock signal without sampling the test clock signal, and the test clock signal is represented as bit alignment information within the one or more test packets.

In one embodiment, an apparatus includes a component configured to receive one or more test packets and generate a plurality of test signals using the one or more test packets. The one or more test packets include test data, test control information, and bit alignment information. The test signals include a test data signal conveying the test data, a test control signal conveying the test control information, and a test clock signal generated using the bit alignment information.

In one embodiment, a method includes receiving one or more test packets and generating a plurality of test signals using the one or more test packets. The one or more test packets include test data, test control information, and bit alignment information. The test signals include a test data signal conveying the test data, a test control signal conveying the test control information, and a test clock signal generated using the bit alignment information.

BRIEF DESCRIPTION OF THE DRAWINGS

The teachings herein can be readily understood by considering the following detailed description in conjunction with the accompanying drawings, in which.

To facilitate understanding, identical reference numerals have been used, where possible, to designate identical elements that are common to the figures.

DETAILED DESCRIPTION

In general, a packet-based testing capability is depicted and described herein, although various other capabilities also may be presented herein.

In at least some embodiments, the packet-based testing capability is configured to provide a packet-based JTAG protocol (referred to herein as a PJTAG protocol). The PJTAG protocol is an asynchronous protocol configured to support the synchronous JTAG protocol. The PJTAG protocol is configured to convert between JTAG signals and packets configured to transport information of the JTAG signals (e.g., to convert JTAG signals into PJTAG packets at an interface from a JTAG domain to a PJTAG domain and to convert PJTAG packets into JTAG signals at an interface from a PJTAG domain to JTAG domain).

Figure 1:
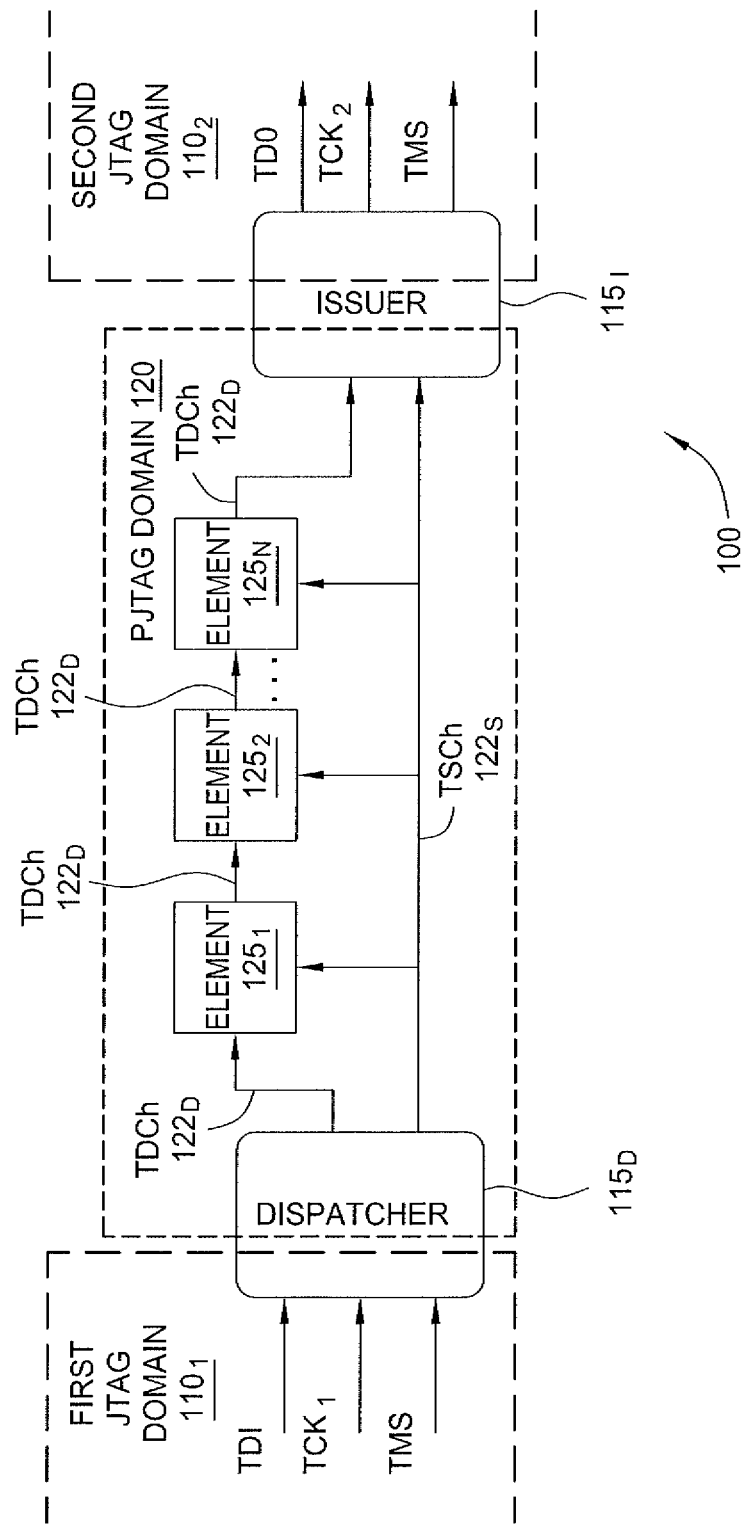
FIG. 1 depicts one embodiment of a JTAG-based testing environment configured to use packet-based JTAG testing.

FIG. 1 depicts one embodiment of a JTAG-based testing environment configured to use packet-based JTAG testing.

The JTAG-based testing environment 100 includes a first JTAG domain 110$_1$ and a second JTAG domain 110$_2$ (collectively, JTAG domains 110) configured to communicate via a packet-based JTAG (PJTAG) domain 120 using a packet-based JTAG (PJTAG) protocol.

The JTAG-based testing environment 100 may be configured to support different types of applications in which the PJTAG protocol may be used. In one embodiment, for example, JTAG-based testing environment 100 may be implemented as a TAP-level PJTAG implementation (e.g., where PJTAG domain 120 may be physically distributed and may include one or more elements where each element may be an individual PJTAG system including a JTAG Test Access Port (TAP) and associated TAP Finite State Machine (FSM)). In one embodiment, for example, JTAG-based testing environment 100 may be implemented as a component-level PJTAG implementation (e.g., PJTAG domain 120 is a JTAG system including one or more elements where each element may be a component of the JTAG system).

The JTAG domains 110 each support propagation of the following types of JTAG signals: (1) test data signals (i.e., Test Data Input (TDI) and Test Data Output (TDO)) and (2) test control signals (i.e., Test Mode State (TMS), Test Clock (TCK), and, optionally, TSTR (an optional Reset Signal)). For purposes of clarity, first JTAG domain $110_1$ is depicted as supporting the JTAG TDI signal, the JTAG TCK signal (denoted as $TCK_1$, which is local to first JTAG domain $110_1$), and the JTAG TMS signal, and, similarly, second JTAG domain $110_2$ is depicted as supporting the JTAG TDO signal, the JTAG TCK signal (denoted as $TCK_2$, which is local to second JTAG domain $110_2$), and JTAG TMS signal. The JTAG domains 110 may be any suitable types of JTAG domains, which may depend upon the application for which the PJTAG protocol is used. The JTAG domains 110 also may support propagation of scan control signals associated with the Finite State Machine (FSM) of the Test Access Port (TAP), such as ShiftDR, UpdateDR, Select, CaptureDR, and the like.

The PJTAG domain 120 may be any suitable type of domain, which may depend upon the application for which the PJTAG protocol is used. In one embodiment, for example, in the case of TAP-level PJTAG, PJTAG domain 120 may be a communication network supporting packet-based communications (e.g., an Ethernet network, the Internet, and the like). In one embodiment, for example, in the case of component-level PJTAG, PJTAG domain 120 may be a communication medium within a JTAG system (e.g., supporting internal communication between components of the JTAG system). The PJTAG domain 120 may be any other suitable type of domain configured to support propagation of packets in accordance with the PJTAG protocol.

The PJTAG domain 120 is configured to support propagation of JTAG testing information (e.g., test data and test control information and, optionally, scan control information), using packets, in accordance with the PJTAG protocol. The PJTAG domain 120 includes a Test Data Channel (TDCh) $122_D$ that is configured to propagate packets including test data (denoted herein as test data packets) and a Test Signaling Channel (TSCh) $122_S$ that is configured to propagate packets including test control information (and, optionally, scan control information) related to the test data (denoted herein as test control packets).

The TDCh $122_D$ and the TSCh $122_S$ are channels configured to support packet-based communications, and may be implemented in any suitable manner. In one embodiment, as depicted in FIG. 1, TDCh $122_D$ and TSCh $122_S$ may be implemented using separate physical channels. In one embodiment, which is omitted from FIG. 1 for purposes of clarity, TDCh $122_D$ and TSCh $122_S$ may be implemented as separate logical channels sharing medium common physical channel. In one embodiment, which also is omitted from FIG. 1 for purposes of clarity, TDCh $122_D$ and the TSCh $122_S$ may be implemented using a common logical channel in which test data and test control information are included within the same packets (which are denoted herein more generally as test packets).

The PJTAG domain 120 includes a plurality of elements $125_1$-$125_N$ (collectively, elements 125). The elements 125 are connected in series using TDCh $122_D$ and are connected in parallel using TSCh $122_S$. The elements 125 may be any suitable type of elements, which may depend upon the application for which the PJTAG protocol is used. In one embodiment, for example, in the case of a TAP-level PJTAG implementation (e.g., where PJTAG domain 120 may be physically distributed), each of the elements 125 may be an individual PJTAG system including a JTAG TAP and associated TAP FSM. In one embodiment, for example, in the case of component-level PJTAG implementation (e.g., where PJTAG domain 120 is a JTAG system), each of the elements 125 may be a component of the JTAG system. The elements 125 may be any other suitable type of elements configured for use within a PJTAG domain.

The JTAG-based testing environment 100 includes a pair of components 115 configured to convert information between the format used in the JTAG domains 110 (e.g., JTAG TAP signals and, optionally, FSM control signals) and the format used in the PJTAG domain 120 (e.g., test packets or a combination of test data packets and test control packets). The pair of components 115 includes a dispatcher $115_D$ and an issuer $115_I$.

The dispatcher $115_D$ is configured to function as an interface between first JTAG domain $110_1$ and PJTAG domain 120. The dispatcher $115_D$ is configured to convert information from the format used in the first JTAG domain $110_1$ (e.g., JTAG TAP signals and, optionally, FSM control signals) to the format used in the PJTAG domain 120 (e.g., PJTAG packets including test data packets and test control packets). The set of functions that dispatcher $115_D$ is configured to perform may depend on the type of implementation of JTAG-based testing environment 100 (e.g., whether TAP-level, component-level, or some other implementation).

In one embodiment, for example, when the dispatcher $115_D$ is used within a TAP-level implementation (as depicted in FIG. 1), dispatcher $115_D$ is configured to perform the following functions. The dispatcher $115_D$ is configured to receive a test data signal conveying test data, a test control signal conveying test control information (e.g., a test mode state signal conveying test mode state information), and a test clock signal conveying a test clock. The dispatcher $115_D$ is configured to (1) generate one or more test data packets via sampling of the test data signal using the test clock signal without sampling the test clock signal; and (2) propagate the one or more test data packets via TDCh $122_D$ in the PJTAG domain 120. The dispatcher $115_D$ is configured to (1) generate one or more test control packets via sampling of the test control signal based using the test clock signal without sampling the test clock signal and (2) propagate the one or more test control packets via TSCh $122_S$ in the PJTAG domain 120. In one embodiment, for example, sampling a signal (e.g., test data signal, test control signal, and the like) using the test clock signal may include sampling the value of the signal at each rising edge of the test clock signal such that the value may be placed within the appropriate packet. The dispatcher $115_D$ also is configured to represent the test clock signal as bit alignment information within the one or more test data packets and the one or more test control packets. It is noted that the bit alignment information may be considered to indicate the manner in which the values of the signals (e.g., the test data signal and the test control signal) were distributed within the packets, i.e. the manner in which the values of the signals were sliced when sampled for placing the associated values of the signals into the packets. For example, the test data signal may be a JTAG TDI/TDO signal, the test control signal may be a JTAG TMS signal, and the test clock signal may be a JTAG TCK signal.

In one embodiment, for example, when the dispatcher $115_D$ is used within a component-level implementation (omitted from FIG. 1 for purposes of clarity), dispatcher $115_D$ is configured to perform the functions described for the TAP-level implementation as well as additional functions related to propagation of scan control information via the PJTAG domain 120. The dispatcher $115_D$ is configured to receive scan control signals (e.g., ShiftDR, UpdateDR, Select, CaptureDR, and the like) including scan control information related to a TAP FSM, generate the one or more test control packets such that they also include the scan control information from the scan control signals, and propagate the one or more test control packets (including the scan control information) via TSCh $122_S$ in the PJTAG domain 120.

The issuer $115_I$ is configured to function as an interface between PJTAG domain 120 and second JTAG domain $110_2$. The issuer $115_I$ is configured to convert information from the format used in the PJTAG domain 120 (e.g., PJTAG packets including test data packets and test control packets) and the format used in the second JTAG domain $110_2$ (e.g., JTAG TAP signals and, optionally, FSM control signals). The set of functions that the issuer $115_I$ is configured to perform may depend on the type of implementation of JTAG-based testing environment 100 (e.g., whether TAP-level, component-level, or some other implementation).

In one embodiment, for example, when the issuer $115_I$ is used within a TAP-level implementation (as depicted in FIG. 1), issuer $115_I$ is configured to perform the following functions. The issuer $115_I$ is configured to receive one or more test data packets via TDCh $122_D$ in the PJTAG domain 120 and to receive one or more test control packets via TSCh $122_S$ in the PJTAG domain 120. The test data packets include test data and bit alignment information that is representative of test control timing information, and the test control packets include test control information (e.g., test mode state information) and bit alignment information that is representative of test control timing information. The issuer $115_I$ is configured to generate, from the one or more test data packets, a test data signal conveying the test data, and propagate the test data signal via a test data signal path. The issuer $115_I$ is configured to generate, from the one or more test control packets, a test control signal conveying the test control information (e.g., a test mode state signal conveying test mode state information), and propagate the test control signal via a test control signal path. The issuer $115_I$ is configured to generate, using the bit alignment information from the one or more test data packets and the bit alignment information from the one or more test control packets, a test clock signal conveying the test control timing information, and propagate the test clock signal via a test clock signal path. In one embodiment, for example, a local oscillator may be used to generate a clock signal and the bit alignment information may then be used to gate the clock signal to form thereby the test clock signal. In one such embodiment, if a packet reception queue of the issuer $115_I$ is empty, the clock can be gated so that the scan chain is frozen until new packets arrive at the issuer $115_I$. For example, the test data signal may be a JTAG TDI/TDO signal, the test control signal may be a JTAG TMS signal, and the test clock signal may be a JTAG TCK signal.

In one embodiment, for example, when the issuer $115_I$ is used within a component-level implementation (omitted from FIG. 1 for purposes of clarity), issuer $115_I$ is configured to perform the functions described for the TAP-level implementation as well as additional functions related to propagation of scan control information via the PJTAG domain 120. The issuer $115_I$ is configured to receive one or more test control packets that also include scan control information, generate scan control signals (e.g., ShiftDR, UpdateDR, Select, CaptureDR, and the like) including the scan control information, and propagate the scan control signals via a scan control signal path.

The components 115 each may be implemented in any suitable manner. For example, a component 115 (e.g., dispatcher $115_D$ and/or issuer $115_I$) may be implemented using one or more hardware elements configured to provide the dispatcher and/or issuer functions, using a processor that is configured to execute instructions configured to provide the dispatcher and/or issuer functions, and the like, as well as various combinations thereof.

In PJTAG domain 120, the packets may be implemented using any suitable format.

In one embodiment, for example, a test data packet used to transport test data signals via TDCh $122_D$ may have a packet format including the following fields: (1) Test_Data, including up to TDSize elements, (2) Used Bytes (if <TDSize), and (3) Bit_Position indicating the cardinal position of the first bit of the test data packet. This packet format allows up to TDSize test data bits of the test data signal to be sent within a packet. The Bit_Position field allows each element (e.g., each PJTAG component in a TAP-level implementation, each scan chain component in a component-level implementation, and the like) to align the Test_Data from the test data packet with the associated control information being propagated via TSCh $122_S$ in an associated test control packet. It is noted that the TDSize parameter may be a fixed value, or may be adapted to the transmission situation.

In one embodiment, for example, a test control packet used to transport test control information via TSCh $122_S$ may have a packet format including the following fields: (1) Test_Control_Data, including up to TSSize elements, (2) Used Bytes (if <TSSize), and (3) Bit_Position indicating the cardinal position of the first bit of the test control packet. This packet format allows up to TSSize test control bits (and, optionally, scan control bits) to be sent within a packet. The Bit_Position field allows each element (e.g., each PJTAG component in a TAP-level implementation, each scan chain component in a component-level implementation, and the like) to align the Test_Control_Data from the test control packet with the associated test data being propagated via TDCh $122_D$ in an associated test data packet. It is noted that the TSSize parameter may be a fixed value, or may be adapted to the transmission situation. Although primarily depicted and described in FIG. 1 with respect to embodiments in which the test data and test control information (and, optionally, scan control information) are conveyed using separate test data packets and test control packets (e.g., via separate physical connections or separate logical channels of a common physical connection), it is noted that in one embodiment the test data and test control information (and, optionally, scan control information) may be conveyed within the same test packets). In one such embodiment, a test data packet used to transport the test data signal and the test control signal (and, optionally, the scan control signal) may have a packet format including the following fields: (1) Test_Data, including up to TDSize elements, (2) Used Bytes (if <TDSize) for the Test_Data, (3) Test_Control_Data, including up to TSSize elements, (4) Used Bytes (if <TSSize) for the Test_Control_Data, and (5) Bit_Position indicating the cardinal position of the first bit of the test packet. This packet format allows up to TDSize test data bits of the test data signal and up to TSSize test control bits (and, optionally, scan control bits) to be sent within a packet. The Bit_Position field allows each element (e.g., each PJTAG component in a TAP-level implementation, each scan chain component in a component-level implementation, and the like) to perform alignment operations. It is noted that the TDSize and/or TSSize parameters may be fixed values and/or may be adapted to the transmission situation.

It is noted that, within PJTAG domain 120, synchronization between testing data and its associated control information is performed using the bit alignment information included within the packets of the PJTAG domain 120. As a result, there is no need to transport the TCK signal via PJTAG domain 120 and, thus, no need to sample the TCK signal at the dispatcher $115_D$ or to recover TCK values at the issuer $115_I$. This is depicted in FIG. 1, with dispatcher $115_D$ being configured to terminate the local TCK signal (illustratively, $TCK_1$) that is received from the first JTAG domain $110_1$ and, similarly, with issuer $115_I$ being configured to generate a local TCK signal (illustratively, $TCK_2$) to be provided to second JTAG domain $110_2$. As a result, the two JTAG clocks $TCK_1$ and $TCK_2$ are completely independent in terms of both frequency and synchronization and, thus, can be optimized to the needs of first JTAG domain $110_1$ and second JTAG domain $110_2$, respectively. In other words, remote components are able to run on local clocks respectively. The alignment of the test data of TDCh $122_D$ and the control information of TSCh $122_S$ in order to maintain such synchronization may be performed in any suitable manner (e.g., by bitwise shifting values of the Test_Data field of test data packets propagated via TDCh $122_D$). The alignment of JTAG signals in second JTAG domain $110_2$ may be performed in any suitable manner (e.g., issuer $115_I$ may be configured to use buffering and gating on its local JTAG clock $TCK_2$ in order to correct for latencies between packets received at issuer $115_I$ via PJTAG domain 120).

It is noted that conversion between JTAG domains 110 and PJTAG domain 120 should not have any timing problems associated therewith. This will be appreciated when considering that JTAG clocks typically are quite slow given the propagation time over long wiring. In any event, dispatcher $115_D$ does not have any associated timing constraints, since it may simply send PJTAG packets when needed. The issuer $115_I$, on the other hand, may have to handle timing constraints associated with conversion between PJTAG packets in the PJTAG domain 120 and JTAG signals in the second JTAG domain $110_2$. For example, issuer $115_I$ may be configured to buffer received PJTAG packets (and, if needed, freeze the output clock when the buffer empties), in order to generate continuous JTAG signals for second JTAG domain $110_2$.

In this manner, the PJTAG protocol is an asynchronous packet protocol that is functionally equivalent to the synchronous JTAG protocol in terms of supporting the following two principles upon which JTAG is based: (1) serial scan of bits from the TDI to the TDO, and (2) synchronous assertion of the control signals on the elements of the scan chain. It is noted that connection of the elements 125 of PJTAG domain 120 in series via TDCh $122_D$ enables packets sent over TDCh $122_D$ to traverse the elements 125 of PJTAG domain 120 in series (thereby replicating principle (1) of JTAG discussed above) and connection of the elements 125 of PJTAG domain 120 in parallel via TSCh $122_S$ enables packets sent over TSCh $122_S$ to be received by the elements 125 of PJTAG domain 120 at substantially the same time (thereby replicating principle (2) of JTAG discussed above). In other words, there is a functional equivalence of the asynchronous PJTAG protocol and the synchronous JTAG protocol, thereby enabling a JTAG controller to see both JTAG components and PJTAG components on the scan chain (i.e., the interface is transparent).

As noted above, the PJTAG protocol depicted and described with respect to FIG. 1 may be used to directly translate JTAG signals into PJTAG packets. An example of direct translation from JTAG signals into PJTAG packets for an exemplary TAP-based implementation is depicted and described with respect to FIG. 2.

Figure 2:
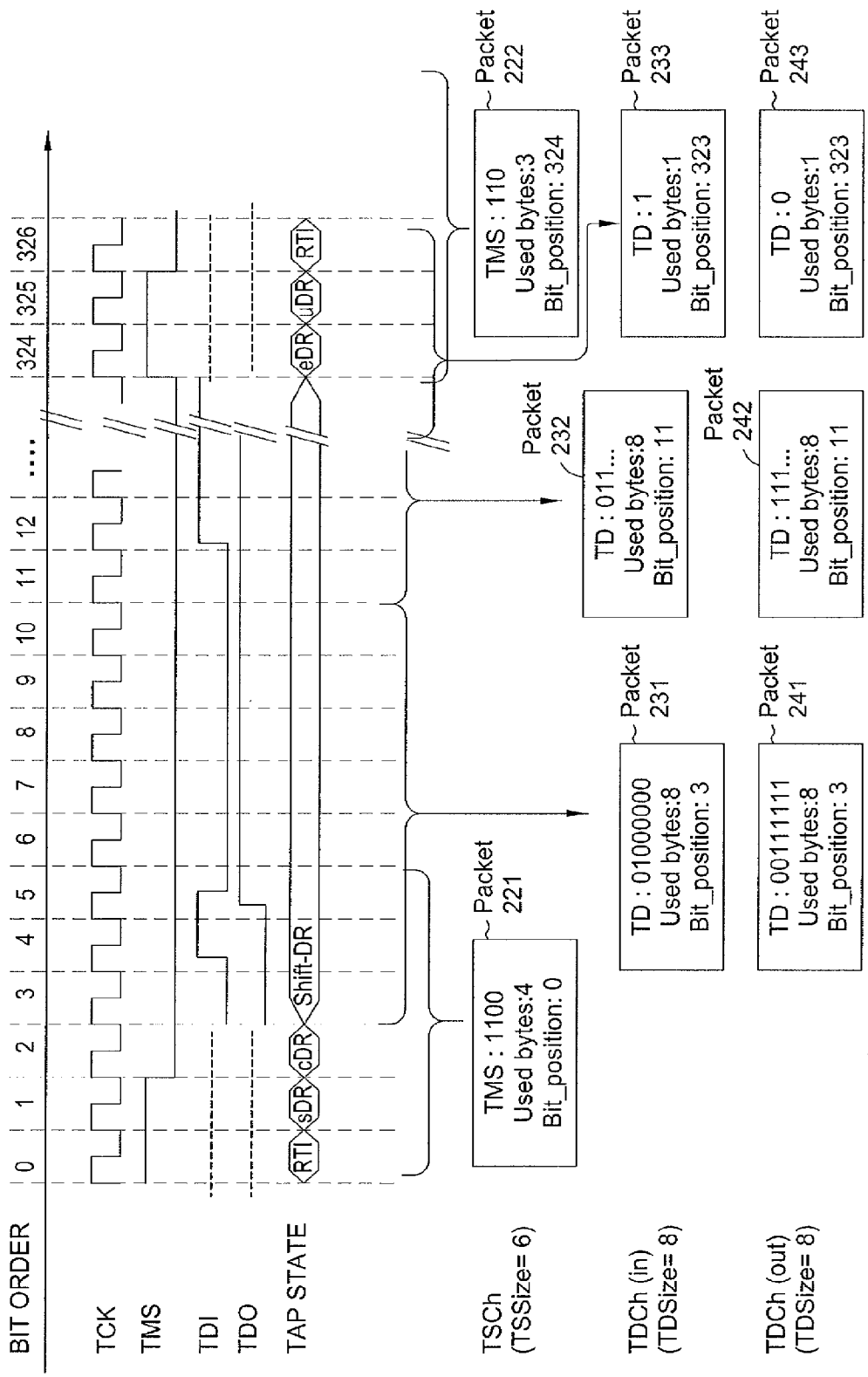
FIG. 2 depicts an exemplary translation of JTAG signals into PJTAG packets for an exemplary TAP-based implementation of the JTAG-based testing environment of FIG. 1.

FIG. 2 depicts an exemplary translation of JTAG signals into PJTAG packets for an exemplary TAP-based implementation of the JTAG-based testing environment of FIG. 1.

As depicted in FIG. 2, an exemplary JTAG chronogram 210 illustrates five JTAG signals associated with testing, including two test data signals (i.e., TDI and TDO), two test control signals (i.e., TMS and TCK), and a scan control signal (denoted as TAP State, which may include scan control signals such as RTI, SHIFT-DR, and the like). The exemplary JTAG chronogram 210 is shifting 320 bits over 327 clock cycles.

As depicted in FIG. 2, portions of the exemplary JTAG chronogram 210 are converted into associated PJTAG packets.

On TSCh $122_S$, the test control packets have a size of TSSize=6 bits. A first portion of the TMS signal is converted into a PJTAG packet 221 in which the Test_Control_Data field includes four bits (illustratively, 1100) from the TMS signal, the Used_Bytes field indicates that four bits are used, and the Bit_Position field indicates a bit position of 0. A second portion of the TMS signal is converted into a PJTAG packet 222 in which the Test_Control_Data field includes three bits (illustratively, 110) from the TMS signal, the Used_Bytes field indicates that three bits are used, and the Bit_Position field indicates a bit position of 324.

On TDCh $122_D$ (when used to transport a TDI signal bitstream), the test data packets have a size of TDSize=8 bits. A first portion of the TDI signal is converted into a PJTAG packet 231 in which the Test_Data field includes eight bits (illustratively, 01000000) from the TDI signal, the Used_Bytes field indicates that eight bits are used, and the Bit_Position field indicates a bit position of 3. A second portion of the TDI signal is converted into a PJTAG packet 232 in which the Test_Data field includes eight bits (illustratively, 011 . . . ) from the TDI signal, the Used_Bytes field indicates that eight bits are used, and the Bit_Position field indicates a bit position of 11. A third portion of the TDI signal is converted into a PJTAG packet 233 in which the Test_Data field includes one bit (illustratively, 0) from the TDI signal, the Used_Bytes field indicates that one bit is used, and the Bit_Position field indicates a bit position of 323.

On TDCh $122_D$ (when used to transport a TDO signal bitstream), the test data packets have a size of TDSize=8 bits. A first portion of the TDO signal is converted into a PJTAG packet 241 in which the Test_Data field includes eight bits (illustratively, 00111111) from the TDI signal, the Used_Bytes field indicates that eight bits are used, and the Bit_Position field indicates a bit position of 3. A second portion of the TDO signal is converted into a PJTAG packet 242 in which the Test_Data field includes eight bits (illustratively, 111 . . . ) from the TDO signal, the Used_Bytes field indicates that eight bits are used, and the Bit_Position field indicates a bit position of 11. A third portion of the TDO signal is converted into a PJTAG packet 243 in which the Test_Data field includes one bit (illustratively, 0) from the TDO signal, the Used_Bytes field indicates that one bit is used, and the Bit_Position field indicates a bit position of 323.

It is noted that the translation of JTAG signals into PJTAG packets that is depicted in FIG. 2 is merely exemplary (e.g., any other suitable JTAG signals having any other suitable values may be used, any other suitable number of bits shifted over any other suitable number of clock cycles may be used, and the like, as well as various combinations thereof).

Although primarily depicted and described in FIG. 1 and FIG. 2 with respect to embodiments in which the test data and test control information (and, optionally, scan control information) is conveyed using separate test data packets and test control packets (e.g., via separate physical connections or separate logical channels of a common physical connection), it is noted that in one embodiment the test data and test control information (and, optionally, scan control information) may be conveyed within the same test packets). Exemplary methods associated with transport of test data and test control information (and, optionally, scan control information) within the same test packets are depicted and described in FIGS. 3 and 5. Exemplary methods associated with transport of test data and test control information (and, optionally, scan control information) using separate test data packets and test control packets are depicted and described in FIGS. 4 and 6.

Figure 3:
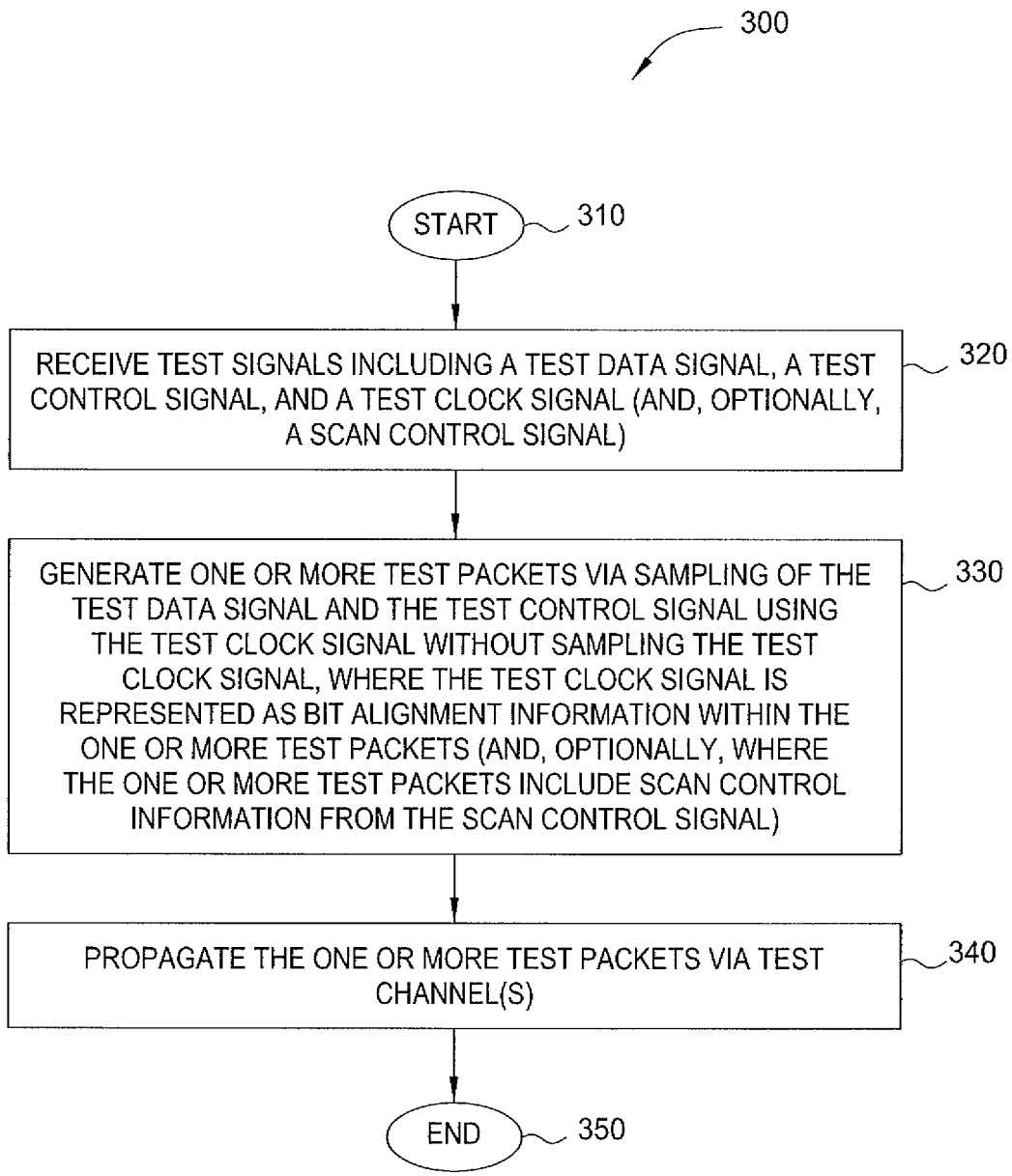
FIG. 3 depicts one embodiment of a method for converting JTAG signals of a JTAG domain into PJTAG packets of a PJTAG domain.

FIG. 3 depicts one embodiment of a method for converting JTAG signals of a JTAG domain into PJTAG packets of a PJTAG domain. Although the steps of method 300 are depicted and described as being performed serially in a specific order, it will be appreciated that steps of method 300 (and/or portions thereof) may be performed contemporaneously and/or in a different order than presented in FIG. 3. It will be appreciated that the steps of method 300 may be performed by dispatcher $115_D$ depicted and described with respect to FIG. 1, or by any other suitable component(s) configured to provide such functions.

At step 310, method 300 begins.

At step 320, test signals are received. The test signals include a test data signal, a test control signal, and a test clock signal. In a JTAG domain, for example, the test data signal may be a JTAG TDI signal or a JTAG TDO signal, the test control signal may be a JTAG TMS signal, and the test clock signal may be a JTAG TCK signal. The test signals optionally may include a scan control signal (e.g., in a component-level implementation).

At step 330, one or more test packets are generated via sampling of the test data signal and the test control signal using the test clock signal without sampling the test clock signal, and the test clock signal is represented as bit alignment information within the one or more test packets. It is noted that, where scan control information is received via a scan control signal, the one or more test packets also may be generated to include scan control information from the scan control signal.

At step 340, the one or more test packets are propagated via a test channel or test channels.

In one embodiment, values from the test data signal and values from the test control signal may be combined within the same test packets. In this case, the test channel may be considered to be a single logical channel shared by the test data and the test control information.

In one embodiment, values from the test data signal and values from the test control signal may be confined to separate test packets, such as where the test packets include one or more test data packets including values sampled from the test data and one or more test control packets including values sampled from the test control signal. In this case, the test channels may be considered to be separate logical channels of a common physical channel or separate physical channels. An exemplary embodiment of a method for converting JTAG signals of a JTAG domain into PJTAG packets of a PJTAG domain for this case is depicted and described with respect to FIG. 4.

At step 350, method 300 ends. Although depicted and described as ending for purposes of clarity, it will be appreciated that method 300 may continue to be performed as long as test data signals and associated test control signals continues to be received.

Figure 4:
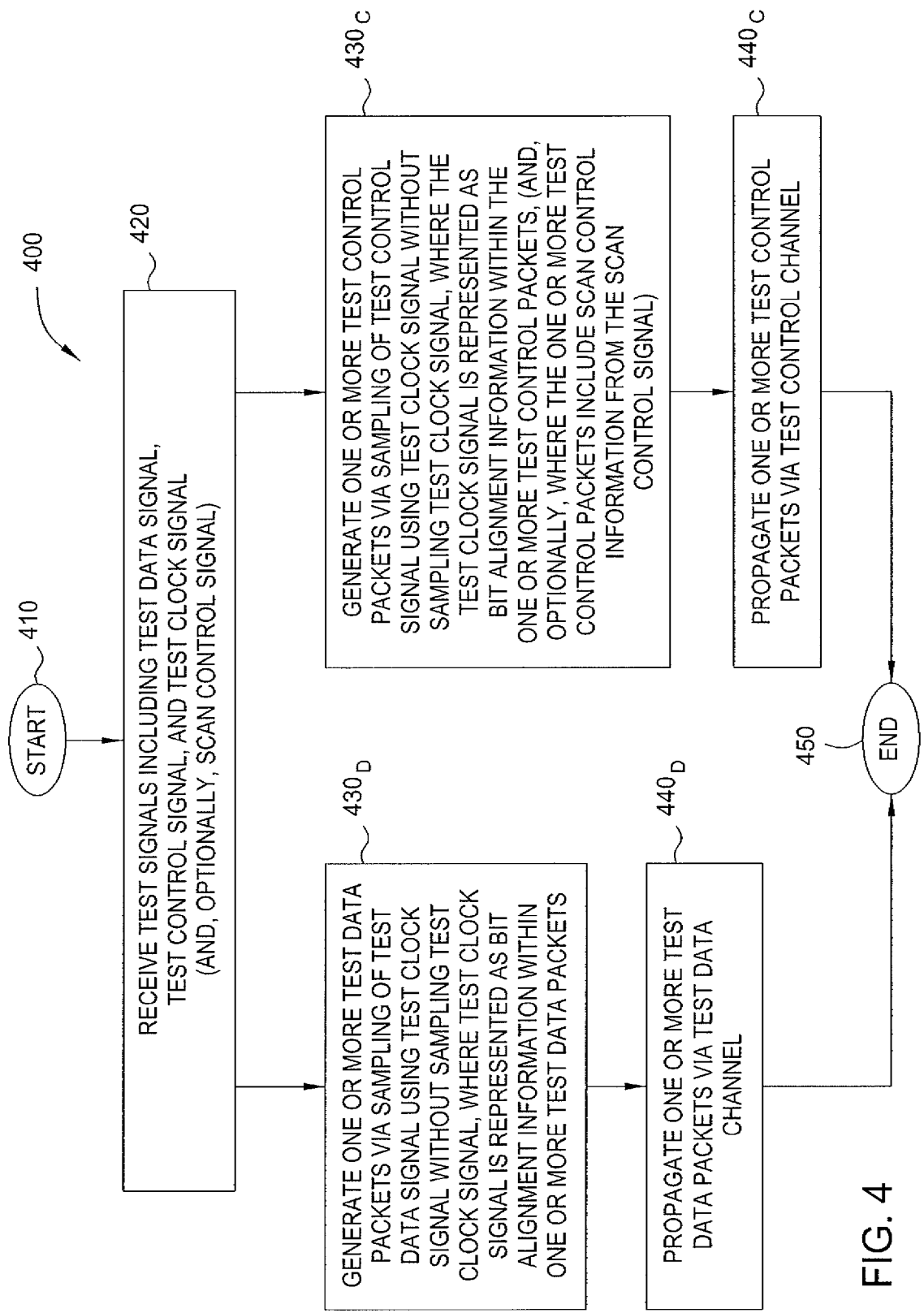
FIG. 4 depicts one embodiment of a method for converting JTAG signals of a JTAG domain into PJTAG packets of a PJTAG domain.

FIG. 4 depicts one embodiment of a method for converting JTAG signals of a JTAG domain into PJTAG packets of a PJTAG domain. Although depicted and described as being performed using a specific arrangement of serial and parallel steps, it will be appreciated that the steps of method 400 may be performed in any suitable manner, which may depend, at least in part, on the timing with which the JTAG signals are received. It will be appreciated that the steps of method 400 may be performed by dispatcher $115_D$ depicted and described with respect to FIG. 1, or by any other suitable component(s) configured to provide such functions.

At step 410, method 400 begins.

At step 420, test signals are received. The test signals include a test data signal, a test control signal, and a test clock signal. In a JTAG domain, for example, the test data signal may be a JTAG TDI signal or a JTAG TDO signal, the test control signal may be a JTAG TMS signal, and the test clock signal may be a JTAG TCK signal. The test signals optionally may include a scan control signal (e.g., in a component-level implementation).

From step 420, the method 400 branches into two paths associated with transport of test data and control information via a PJTAG domain, respectively. The steps of the first path associated with transport of test data are indicated using subscripts of "D" and the steps of the second path associated with transport of control information are indicated using subscripts of "C".

At step $430_D$, one or more test data packets are generated (1) via sampling of the test data signal using the test clock signal without sampling the test clock signal and (2) by representing the test clock signal as bit alignment information within the one or more test data packets. At step $440_D$, the one or more test data packets are propagated via a test data channel of a PJTAG domain. From step $440_D$, method 400 proceeds to step 450, where method 400 ends.

At step $430_C$, one or more test control packets are generated. The one or more test control packets are generated (1) via sampling of the test control signal using the test clock signal without sampling the test clock signal and (2) by representing the test clock signal as bit alignment information within the one or more test control packets. It is noted that, where scan control information is received via a scan control signal, the one or more test control packets also may be generated to include scan control information from the scan control signal. At step $440_C$, the one or more test control packets are propagated via a test control channel of a PJTAG domain. From step $440_C$, method 400 proceeds to step 450, where method 400 ends.

At step 450, method 400 ends. Although depicted and described as ending for purposes of clarity, it will be appreciated that the steps of method 300 may continue to be performed as long as test data signals and associated test control information signals continues to be received via a JTAG interface.

Figure 5:
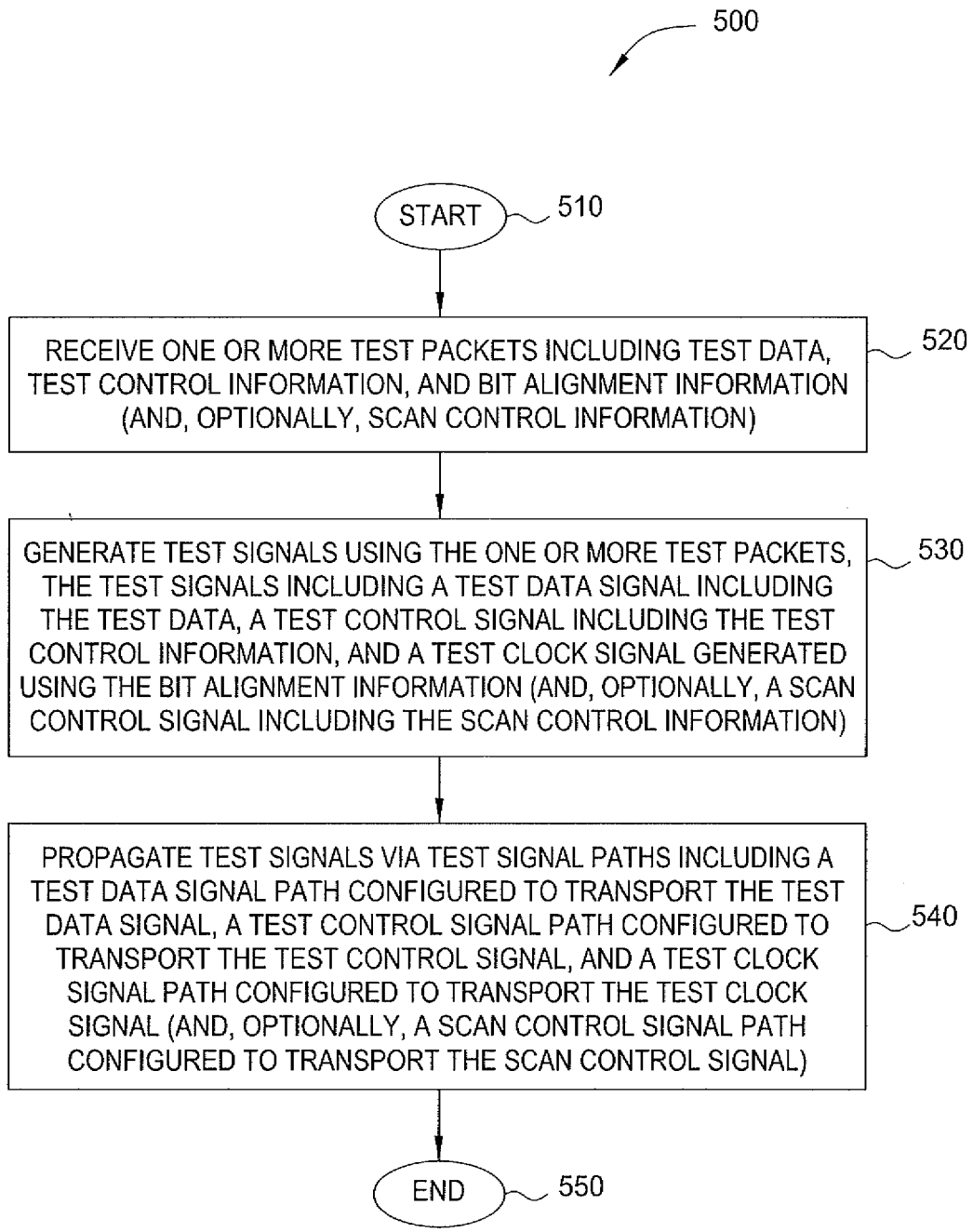
FIG. 5 depicts one embodiment of a method for converting PJTAG packets of a PJTAG domain into JTAG signals of a JTAG domain.

FIG. 5 depicts one embodiment of a method for converting PJTAG packets of a PJTAG domain into JTAG signals of a JTAG domain. Although the steps of method 500 are depicted and described as being performed serially in a specific order, it will be appreciated that steps of method 500 (and/or portions thereof) may be performed contemporaneously and/or in a different order than presented in FIG. 5. It will be appreciated that the steps of method 500 may be performed by issuer $115_I$ depicted and described with respect to FIG. 1, or by any other suitable component(s) configured to provide such functions.

At step 510, method 500 begins.

At step 520, one or more test packets are received. The one or more test packets include test data, test control information, and bit alignment information. The one or more test packets optionally may include scan control information (e.g., in a component-level implementation).

At step 530, test signals are generated using the one or more test packets. The test signals include a test data signal including the test data, a test control signal including the test control information, and a test clock signal generated using the bit alignment information. It is noted that, where scan control information is received within the one or more test packets, the test signals also may include a scan control signal including the scan control information.

At step 540, the test signals are propagated via test signal paths. The test signal paths including test data signal path configured to transport the test data signal, a test control signal path configured to transport the test control signal, and a test clock signal path configured to transport the test clock signal. It is noted that, where scan control information is received within the one or more test packets, the test signal paths also may include a scan control signal path configured to transport the scan control signal.

In one embodiment, values of the test data and values of the test control information may be combined within the same test packets. In this case, the one or more test packets may be received via a test channel that is considered to be a single logical channel shared by the test data and the test control information.

In one embodiment, values of the test data signal and values of the test control information may be confined to separate test packets, such as where the test packets include one or more test data packets including the test data and one or more test control packets including the test control information. In this case, one or more test packets may be received via a test data channel and a test control channel that are considered to be separate logical channels of a common physical channel or separate physical channels. An exemplary embodiment of a method for converting PJTAG packets of a PJTAG domain into JTAG signals of a JTAG domain for this case is depicted and described with respect to FIG. 6.

In a JTAG domain, for example, the test data signal may be a JTAG TDI signal or a JTAG TDO signal, the test control signal may be a JTAG TMS signal, and the test clock signal may be a JTAG TCK signal.

At step 550, method 500 ends. Although depicted and described as ending for purposes of clarity, it will be appreciated that the steps of method 500 may continue to be performed as long as test data and associated control information continues to be received via a PJTAG domain.

Figure 6:
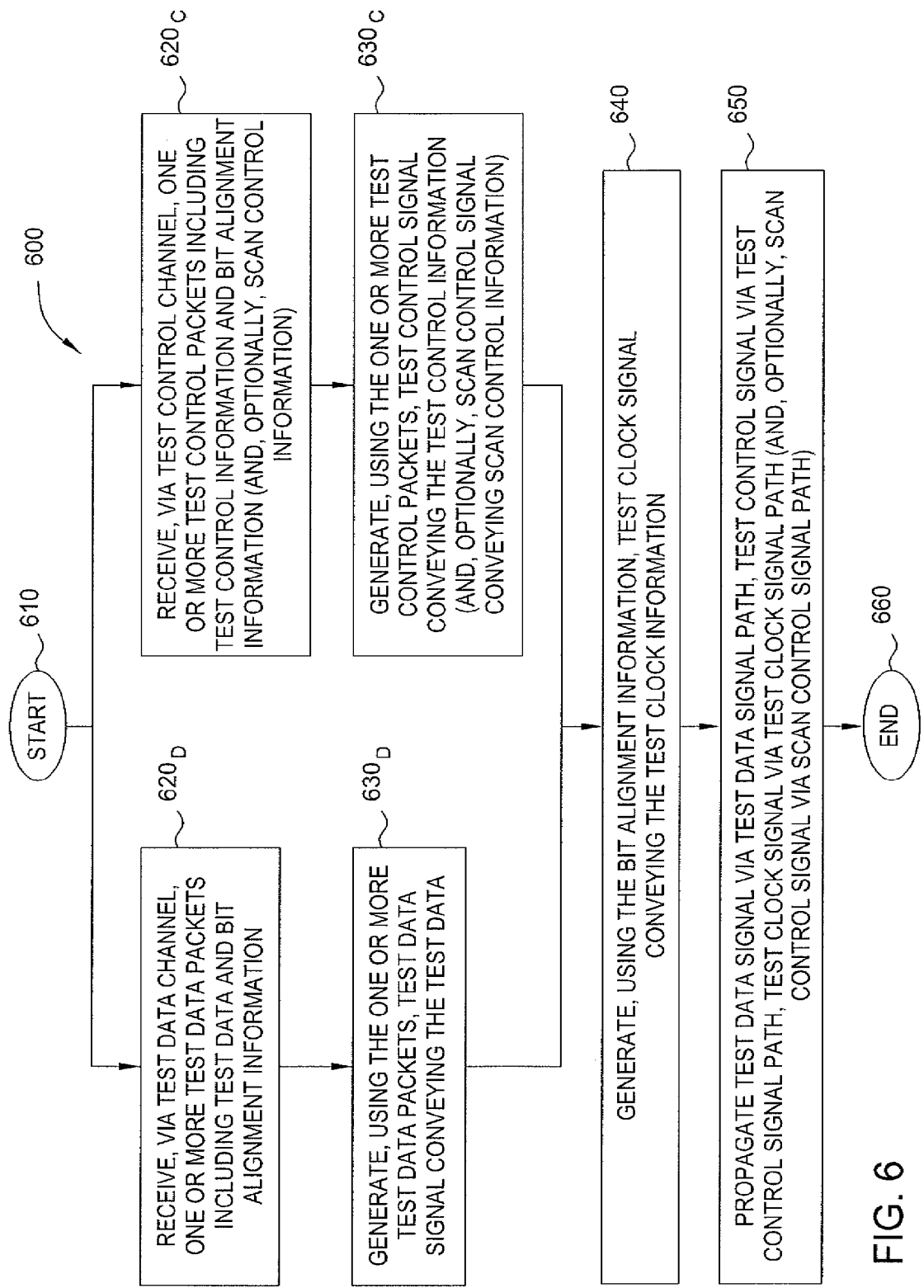
FIG. 6 depicts one embodiment of a method for converting PJTAG packets of a PJTAG domain into JTAG signals of a JTAG domain.

FIG. 6 depicts one embodiment of a method for converting PJTAG packets of a PJTAG domain into JTAG signals of a JTAG domain. Although depicted and described as being performed using a specific arrangement of serial and parallel steps, it will be appreciated that the steps of method 600 may be performed in any suitable manner, which may depend, at least in part, on the timing with which the PJTAG packets are received. It will be appreciated that the steps of method 600 may be performed by issuer 115$_I$ depicted and described with respect to FIG. 1, or by any other suitable component(s) configured to provide such functions.

At step 610, method 600 begins.

From step 610, method 600 branches into two paths associated with transport of test data and control information via a PJTAG domain, respectively. The steps of the first path associated with transport of test data are indicated using subscripts of "D" and the steps of the second path associated with transport of control information are indicated using subscripts of "C".

At step 620$_D$, one or more test data packets are received via a test data channel of a PJTAG domain. The one or more test data packets include test data and bit alignment information. At step 630$_D$, a test data signal is generated using the one or more test data packets. A The test data signal conveys the test data and is configured for transport via a test data signal path. From step 630$_D$, method 600 proceeds to step 640.

At step 620$_C$, one or more test control packets are received via a test control channel of a PJTAG domain. The one or more test control packets include test control information and bit alignment information. It is noted that the one or more test control packets also may include scan control information. At step 630$_C$, a test control signal is generated using test control information from the one or more test control packets. The test control signal conveys the test control information and is configured for transport via a test control signal path. It is noted that, where scan control information is received within the one or more test control packets, a scan control signal is generated using the scan control information from the one or more test control packets. From step 630$_C$, method 600 proceeds to step 640.

At step 640, a test clock signal is generated using the bit alignment information from the one or more test data packets and the one or more test control packets. The test clock signal conveys test clock information and is configured for transport via a test clock signal path.

At step 650, the generated signals are propagated. The test data signal is propagated via a test data signal path, the test control signal is propagated via a test control signal path, and the test clock signal is propagated via a test clock signal path. It is noted that, where scan control information is received within the one or more test control packets, the scan control signal is propagated via the scan control signal path.

At step 660, method 600 ends. Although depicted and described as ending for purposes of clarity, it will be appreciated that the steps of method 600 may continue to be performed as long as test data and associated control information continues to be received via a PJTAG domain.

In one embodiment, the PJTAG protocol may be configured for use with a network communication interface. In one embodiment, the PJTAG protocol may be wrapped inside of a protocol used for a high-speed interface. For example, the PJTAG protocol may be wrapped inside of the Transmission Control Protocol (TCP)/Internet Protocol (IP) to form a TCP/IP-based wrapping of PJTAG, inside of Universal Serial Bus (USB) packets to form a USB-based wrapping of PJTAG, and the like. An example is illustrated in FIG. 7.

Figure 7:
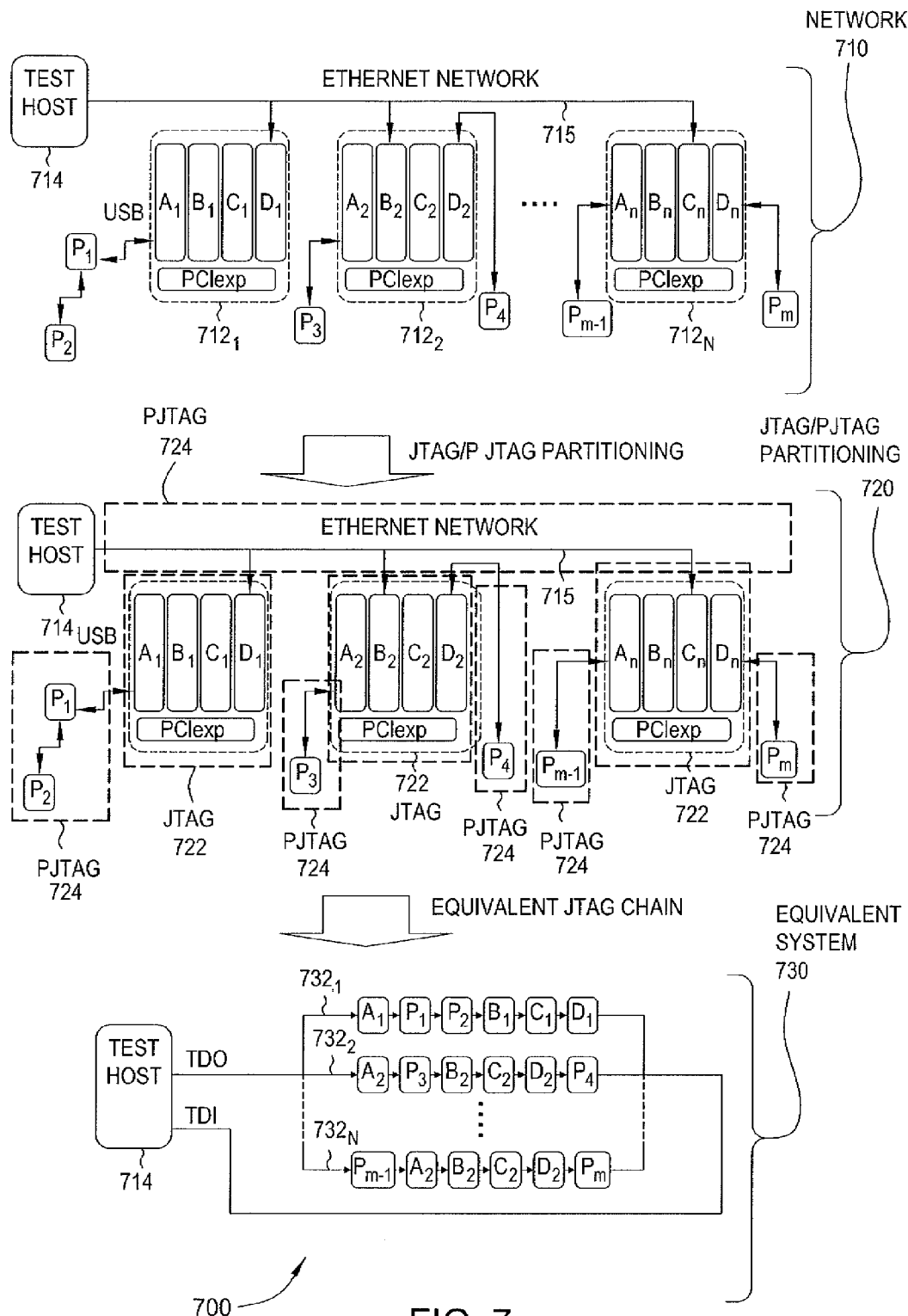
FIG. 7 depicts an exemplary implementation of PJTAG within an exemplary network of nodes.

FIG. 7 depicts an exemplary implementation of PJTAG within an exemplary network of nodes.

As depicted in FIG. 7, the exemplary network 710 includes a plurality of nodes 712$_1$-712$_N$ (collectively, nodes 712) and a test host 714. The nodes 712 and test host 714 are each connected to an Ethernet network 715. As depicted in FIG. 7, each node 712 includes four cards (labeled as cards A, B, C, and D) which are connected via a bus (e.g., PCIExpress in this example). As further depicted in FIG. 7, each node 712 has at least one Peripheral (P) connected thereto through at least one associated USB connection to at least one of the cards of the node 712. The nodes 712 may be any suitable nodes which may be configured and communicatively coupled in this manner (e.g., desktop PCs and/or any other suitable nodes). Although omitted from FIG. 7 for purposes of clarity, it is assumed that each of the cards and peripherals of each of the nodes 712 includes an internal JTAG subsystem.

As depicted in FIG. 7, various embodiments of the PJTAG protocol enable exemplary network 710 to be viewed as a JTAG system despite the fact that the JTAG subsystems of exemplary network 710 are not physically connected together. The PJTAG protocol enables the JTAG subsystems to be interfaced together through high-speed functional connections. This is depicted as JTAG/PJTAG partitioning 720 of FIG. 7, which illustrates which portions of exemplary network 710 are JTAG domains 722 and which portions of exemplary network 710 are PJTAG domains 724. It is noted that, in the JTAG/PJTAG partitioning 720, each JTAG domain 722 corresponds to one of the JTAG domains 710 of FIG. 1 (e.g., either first JTAG domain $110_1$ or second JTAG domain $110_2$, depending upon the orientation of the JTAG domain 722 with respect to an associated PJTAG domain 724) and each PJTAG domain 724 corresponds to the PJTAG domain 120 of FIG. 1. It is further noted that dispatchers (e.g., similar to dispatcher $115_D$ of FIG. 1) may be provided at interface points in a direction from one of the JTAG domains 722 to one of the PJTAG domains 724 and, similarly, issuers (e.g., similar to issuer $115_I$ of FIG. 1) may be provided at interface points in a direction from one of the PJTAG domains 724 to one of the JTAG domains 722.

As noted above, use of PJTAG enables exemplary network 710 to be represented as JTAG/PJTAG partitioning 720. As a result, the test host 714 will see exemplary network 710 as being the equivalent system 730 depicted in FIG. 7. For example, test host 714 sees the cards $712_1$-$712_N$ as having parallel paths $732_1$-$732_N$, respectively, where each path 732 is accessible to test host 714 via TDI/TDO paths and, further, is composed of a respective series of JTAG domains 722 and PJTAG domains 724. For example, a first path $732_1$ of equivalent system 730 that is associated with card $712_1$ includes the following sequence of components: Test Host, $A_1$, $P_1$, $P_2$, $B_1$, $C_1$, $D_1$, Test Host. For example, a second path $732_2$ of equivalent system 730 that is associated with card $712_2$ includes the following sequence of components: Test Host, $A_2$, $P_3$, $B_2$, $C_2$, $D_2$, $P_4$ Test Host. For example, an n-th path $732_N$ of equivalent system 730 that is associated with card $712_N$ includes the following sequence of components: Test Host, $P_{m-1}$, $A_n$, $B_n$, $C_n$, $D_n$, $P_m$, Test Host.

As depicted in FIG. 7, the equivalent system 730 is essentially a multi-drop architecture (e.g., which may be typical of ATCA). Thus, the test host 714 is able to analyze the equivalent system 730 and generate associated testing bitstreams using any suitable tools (which may include traditional testing tools).

It is noted that PJTAG also may be configured for use in various other types of environments.

In one embodiment, for example, PJTAG may be configured for use with System JTAG (SJTAG).

In one embodiment, for example, PJTAG may be configured for use with integrated approaches (e.g., System-on-Chip (SoC), Network-on-Chip (NoC), and the like), where PJTAG could be used as a solution to access the different components for testing and/or maintenance by using already-implemented functional buses and connections. It is noted that FIG. 1 is generic enough to represent at least some such embodiments (e.g., SoC, NoC, and the like).

It is noted that PJTAG can be used to connect through virtually any packet-based interface, as long as a local Dispatcher/Issuer interface is implemented.

In one embodiment, for example, PJTAG may be configured for use in software applications (e.g., software debugging, virtual applications, and the like). The use of JTAG for software debugging is already common in embedded systems. For example, most processors present a JTAG infrastructure to access the embedded hardware components (e.g., internal registers). Debuggers (e.g., GDB and the like) can then be used to remotely debug the processor, with the associated JTAG communications being transparent to the user. In one embodiment, PJTAG may be used to extend this concept to purely software components as follows: a software module can implement a PJTAG interface, thereby making it possible to access internal data structures of the software module as if they were hardware components. The software module can implement a PJTAG interface using a messaging Application Programming Interface (API), such as POSIX or any other suitable messaging API. In one embodiment, this concept of using PJTAG for software components can be used for virtual applications using virtualization software, in which case the virtualization software can present a PJTAG interface and allow access to the data structures modeling the virtualized hardware (which will then appear on the JTAG chain along with the real hardware). An example is depicted and described with respect to FIG. 8.

Figure 8:
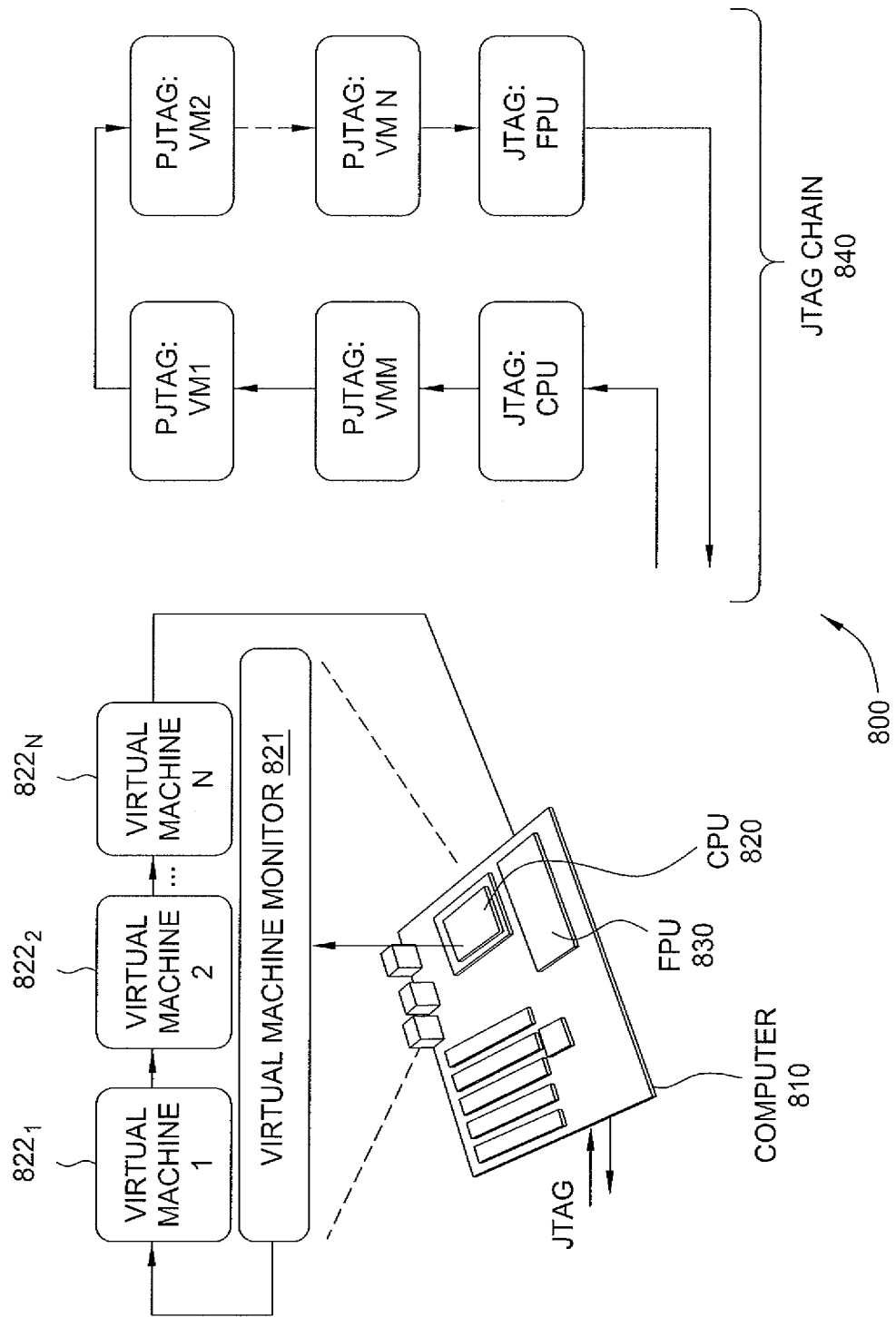
FIG. 8 depicts an exemplary implementation of PJTAG with virtualization software configured to control hardware virtualization.

FIG. 8 depicts an exemplary implementation of PJTAG with virtualization software configured to control hardware virtualization.

As depicted in FIG. 8, a computer 810 includes a General Processing Unit (GPU) motherboard, composed of physical components including a Central Processing Unit (CPU) 820 and an additional acceleration units (illustratively, a Floating-Point Processing Unit (FPU) 830). The physical components of the GPU motherboard are connected in a JTAG chain for debugging and/or maintenance purposes. If the GPU motherboard is used to implement Virtual Hardware, the CPU 820 is configured to run virtual components, including Virtual Machine Monitor (VMM) software 821 which, in turn, is configured to run one or more Virtual Machines (VMs) $822_1$-$822_N$ (collectively, VMs 822).

As further depicted in FIG. 8, via use of PJTAG the virtual components (i.e., VMM 821 and VM(s) 822) can appear directly on the JTAG chain and, thus, be treated in the same manner as the physical components of the JTAG chain. This is illustrated in JTAG chain 840, which includes the following sequence of physical and virtual components: CPU 820 (JTAG domain) 4 VMM 821 (PJTAG domain)→$VM_1$ $822_1$ (PJTAG domain)→$VM_2$ $822_2$ (PJTAG domain)→...→$VM_N$ $822_N$ (PJTAG domain)→FPU (JTAG domain). This greatly simplifies debugging as there is a single unified interface using a common set of tools for both the physical components and the virtual components. Additionally, this also can enable new debugging and monitoring capabilities, because the virtual resources and the hardware running the virtual resources are accessed together via the JTAG chain, thereby simplifying correlation of the behavior of the virtual resources and the hardware running the virtual resources. It is noted that the asynchronous nature of embodiments of PJTAG overcomes the synchronous nature of JTAG that previously prevented integration of software components in the JTAG chain.

Although primarily depicted and described with respect to use of PJTAG in environments that include a combination of JTAG domains and PJTAG domains, it is noted that PJTAG may be used to implement a fully-PJTAG system in which all of the relevant components are connected via packet-based interfaces.

Although primarily depicted and described herein with respect to embodiments in which the test packets transport each of the values of the test signals, it is noted that in at least some embodiments only changes to values of certain signals may be sent within the test packets, thereby reducing the amount of information that needs to be transported via the test packets. For example, since certain test control signals are stable during shifting (e.g., the JTAG TMS signal) such that it is uneconomical to keep sending the same value in the test packets, the sending end (e.g., dispatcher $115_D$) may be configured to only encode changes in the value of a test control signal within the test packets and the bit alignment information can be used to indicate to the receiving end (e.g., issuer $115_I$) that the value of the test control signal has changed. It will be appreciated that similar economizations may be made for other types of signals (e.g., for any other signal or signals were the values are expected to remain the same for a relatively long enough time to justify use of such economizations.

Figure 9:
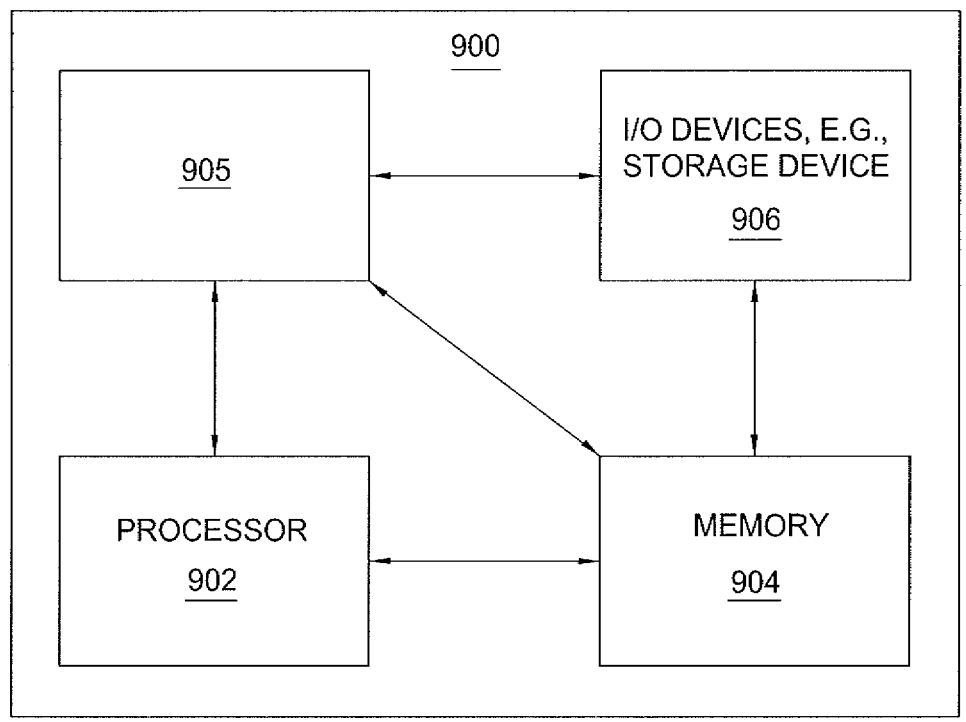
FIG. 9 depicts a high-level block diagram of a computer suitable for use in performing functions described herein.

FIG. 9 depicts a high-level block diagram of a computer suitable for use in performing functions described herein.

As depicted in FIG. 9, computer 900 includes a processor element 902 (e.g., a central processing unit (CPU) and/or other suitable processor(s)) and a memory 904 (e.g., random access memory (RAM), read only memory (ROM), and the like). The computer 900 also may include a cooperating module/process 905 and/or various input/output devices 906 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like)).

It will be appreciated that the functions depicted and described herein may be implemented in software (e.g., via implementation of software on one or more processors) and/or may be implemented in hardware (e.g., using a general purpose computer, one or more application specific integrated circuits (ASIC), and/or any other hardware equivalents).

It will be appreciated that the functions depicted and described herein may be implemented in software (e.g., for executing on a general purpose computer (e.g., via execution by one or more processors) so as to implement a special purpose computer) and/or may be implemented in hardware (e.g., using one or more application specific integrated circuits (ASIC) and/or one or more other hardware equivalents).

In one embodiment, the cooperating process 905 can be loaded into memory 904 and executed by the processor 902 to implement functions as discussed herein. Thus, cooperating process 905 (including associated data structures) can be stored on a computer readable storage medium, e.g., RAM memory, magnetic or optical drive or diskette, and the like.

It will be appreciated that computer 900 depicted in FIG. 9 provides a general architecture and functionality suitable for implementing functional elements described herein and/or portions of functional elements described herein. For example, the computer 900 provides a general architecture and functionality suitable for implementing one or more of portions of dispatcher $115_D$, dispatcher $115_D$, portions of issuer $115_I$, issuer $115_I$, portions of a node 712, a node 712, portions of a test host 714, a test host 714, and the like.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in fixed or removable media, transmitted via a data stream in a broadcast or other signal bearing medium, and/or stored within a memory within a computing device operating according to the instructions.

Although various embodiments which incorporate the teachings of the present invention have been shown and described in detail herein, those skilled in the art can readily devise many other varied embodiments that still incorporate these teachings.

What is claimed is:

1. An apparatus, comprising:
a component configured to:
receive a set of test signals via a first testing domain, the set of test signals comprising a test data signal conveying test data configured to be applied to a device for testing the device, a test control signal conveying test control information configured to control testing of the device using the test data, and a test clock signal, wherein the first testing domain comprises a Joint Test Action Group (JTAG) testing domain, the test data signal is a JTAG Test Data In (TDI) signal or a JTAG Test Data Out (TDO) signal, the test control signal is a JTAG Test Mode Select (TMS) signal, and the test clock signal is a JTAG Test Clock (TCK) signal;
generate a set of test packets based on the set of test signals via sampling of the test data signal and the test control signal using the test clock signal without sampling the test clock signal, the set of test packets comprising the test data, the test control information, and bit alignment information configured to represent the test clock signal, wherein sampling of the test data signal and the test control signal comprises sampling a value of the test data signal and a value of the test control signal at each rising edge of the test clock signal; and
propagate the set of test packets toward a second testing domain.

2. The apparatus of claim 1, wherein at least one test packet in the set of test packets includes at least one value from sampling of the test data signal and at least one value from sampling of the test control signal.

3. The apparatus of claim 1, wherein the set of test packets comprises:
one or more test data packets including values of the test data from sampling of the test data signal; and
one or more test control packets including values of the test control information from sampling of the test control signal.

4. The apparatus of claim 3, wherein the component is further configured to:
propagate the one or more test data packets via a test data channel; and
propagate the one or more test control packets via a test control channel.

5. The apparatus of claim 4, wherein the test data channel and test control channel are separate logical channels.

6. The apparatus of claim 4, wherein the test data channel and test control channel are separate physical channels.

7. The apparatus of claim 1, wherein, to generate the set of test packets, the component is configured to:
generate one or more test data packets via sampling of the test data signal using the test clock signal without sampling the test clock signal; and
generate one or more test control packets via sampling of the test control signal using the test clock signal without sampling the test clock signal.

8. The apparatus of claim 1, wherein the component is further configured to:
receive scan control information via a scan control signal and include the scan control information of the scan control signal in the set of test packets.

9. The apparatus of claim 8, wherein the set of test packets comprises one or more test data packets including values from sampling of the test data signal and one or more test control packets including values from sampling of the test control signal, wherein the component is further configured to include the scan control information in the one or more test control packets.

10. The apparatus of claim 8, wherein the scan control signal comprises a ShiftDR signal, an UpdateDR signal, a Select signal, or a CaptureDR signal.

11. The apparatus of claim 1, wherein at least one of the one or more test packets comprises:
- a respective set of values of the test data determined from sampling of a respective portion of the test data signal using the test clock signal;
- a respective set of values of the test control information determined from sampling of a respective portion of the test control signal using the test clock signal; and
- bit position information indicative of a respective portion of the test clock signal associated with the set of values of the test data determined from sampling of the respective portion of the test data signal using the test clock signal and associated with the set of values of the test control information determined from sampling of the respective portion of the test control signal using the test clock signal.

12. The apparatus of claim 1, wherein the set of test packets comprises:
- one or more test data packets, at least one of the one or more test data packets comprising:
  - a respective set of values of the test data determined from sampling of a respective portion of the test data signal using the test clock signal; and
  - bit position information indicative of a respective portion of the test clock signal associated with the respective set of values of the test data determined from sampling of the respective portion of the test data signal using the test clock signal; and
- one or more test control packets, at least one of the one or more test control packets comprising:
  - a respective set of values of the test control information determined from sampling of a respective portion of the test control signal using the test clock signal; and
  - bit position information indicative of a respective portion of the test clock signal associated with the respective set of values of the test control information determined from sampling of the respective portion of the test control signal using the test clock signal.

13. The apparatus of claim 1, wherein the component is configured to receive the test data signal compliant with a description of a JTAG Test Access Port (TAP) or a description of a JTAG Register.

14. The apparatus of claim 1, wherein the component is configured to propagate the set of test packets via a packet-based connection.

15. The apparatus of claim 14, wherein the packet-based connection comprises at least one of an Ethernet connection, an Internet connection, or a Common Public Radio Interface (CPRI) connection.

16. The apparatus of claim 1, wherein the component is configured to propagate the set of test packets toward a set of elements.

17. The apparatus of claim 16, wherein the set of test packets comprises one or more test data packets including values from sampling of the test data signal and one or more test control packets including values from sampling of the test control signal, wherein the component is configured to:
- propagate the one or more test data packets toward the elements serially; and
- propagate the one or more test control packets toward the elements in parallel.

18. The apparatus of claim 16, wherein at least one of the elements comprises a JTAG system including a Test Access Port (TAP) and a TAP Finite State Machine (FSM).

19. The apparatus of claim 16, wherein at least one of the elements comprises a component of a JTAG system, wherein the component is configured to be disposed after a Test Access Port (TAP) of the JTAG system.

20. The apparatus of claim 1, further comprising:
a component configured to:
- receive the set of test packets; and
- generate, using the set of test packets, a set of test signals comprising a test data signal conveying the test data, a test control signal conveying the test control information, and a test clock signal, wherein the test clock signal is generated using the bit alignment information included within the set of test packets.

21. A method, comprising:
receiving a set of test signals via a first testing domain, the set of test signals comprising a test data signal conveying test data configured to be applied to a device for testing the device, a test control signal conveying test control information configured to control testing of the device using the test data, and a test clock signal, wherein the first testing domain comprises a Joint Test Action Group (JTAG) testing domain, the test data signal is a JTAG Test Data In (TDI) signal or a JTAG Test Data Out (TDO) signal, the test control signal is a JTAG Test Mode Select (TMS) signal, and the test clock signal is a JTAG Test Clock (TCK) signal;
generating a set of test packets based on the set of test signals via sampling of the test data signal and the test control signal using the test clock signal without sampling the test clock signal, the set of test packets comprising the test data, the test control information, and bit alignment information configured to represent the test clock signal wherein sampling of the test data signal and the test control signal comprises sampling a value of the test data signal and a value of the test control signal at each rising edge of the test clock signal; and
propagating the set of test packets toward a second testing domain.

22. An apparatus, comprising:
a component configured to:
receive a set of test packets via a first testing domain, the set of test packets including test data configured to be applied to a device for testing the device, test control information configured to control testing of the device using the test data, and bit alignment information, wherein the set of test packets is generated based on sampling of an input test data signal and an input test control signal using an input test clock signal without sampling the input test clock signal, wherein sampling of the input test data signal and the input test control signal comprises sampling a value of the input test data signal and a value of the input test control signal at each rising edge of the input test clock signal;
generate a set of test signals based on the set of test packets, the set of test signals comprising a test data signal conveying the test data, a test control signal conveying the test control information, and a test clock signal generated using the bit alignment information, wherein the test data signal is a Joint Test Action Group (JTAG) Test Data In (TDI) signal or a JTAG Test Data Out (TDO) signal, the test control signal is a JTAG Test Mode Select (TMS) signal, and the test clock signal is a JTAG Test Clock (TCK) signal; and
propagate the set of test signals toward a second testing domain, wherein the second testing domain comprises a JTAG testing domain.

23. A method, comprising:
receiving a set of test packets via a first testing domain, the set of test packets including test data configured to be applied to a device for testing the device, test control information configured to control testing of the device using the test data, and bit alignment information, wherein the set of test packets is generated based on sampling of an input test data signal and an input test control signal using an input test clock signal without sampling the input test clock signal, wherein sampling of the input test data signal and the input test control signal comprises sampling a value of the input test data signal and a value of the input test control signal at each rising edge of the input test clock signal;
generating a set of test signals based on the set of test packets, the set of test signals comprising a test data signal conveying the test data, a test control signal conveying the test control information, and a test clock signal generated using the bit alignment information, wherein the test data signal is a Joint Test Action Group (JTAG) Test Data In (TDI) signal or a JTAG Test Data Out (TDO) signal, the test control signal is a JTAG Test Mode Select (TMS) signal, and the test clock signal is a JTAG Test Clock (TCK) signal; and
propagating the set of test signals toward a second testing domain, wherein the second testing domain comprises a JTAG testing domain.

24. The apparatus of claim 1, wherein second testing domain is an asynchronous testing domain.

25. The apparatus of claim 22, wherein the first testing domain is an asynchronous testing domain.

* * * * *